(12) United States Patent
Lee et al.

(10) Patent No.: US 7,369,188 B2
(45) Date of Patent: May 6, 2008

(54) THIN FILM TRANSISTOR SUBSTRATE HAVING TWO STORAGE CAPACITORS PER PIXEL, METHOD OF MANUFACTURING THE SAME AND DISPLAY APPARATUS HAVING THE SAME

(75) Inventors: Woo-Geun Lee, Yongin-si (KR); Hye-Young Ryu, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/264,598

(22) Filed: Nov. 1, 2005

(65) Prior Publication Data

US 2006/0238667 A1    Oct. 26, 2006

(30) Foreign Application Priority Data

Apr. 22, 2005    (KR) .................... 10-2005-0033519

(51) Int. Cl.
*G02F 1/1343*    (2006.01)
(52) U.S. Cl. .......................... 349/39; 349/38
(58) Field of Classification Search ............ 349/38, 349/39, 54, 140; 257/59, 72
See application file for complete search history.

(56) References Cited

U.S. PATENT DOCUMENTS

| | | | |
|---|---|---|---|
| 5,008,799 A * | 4/1991 | Montalvo | 363/60 |
| 5,247,289 A * | 9/1993 | Matsueda | 345/98 |
| 5,734,449 A * | 3/1998 | Jang | 349/39 |
| 5,920,221 A * | 7/1999 | Shen et al. | 327/264 |
| 6,255,130 B1 * | 7/2001 | Kim | 438/30 |
| 6,437,839 B1 * | 8/2002 | Cacharelis | 349/39 |
| 6,462,792 B1 * | 10/2002 | Ban et al. | 349/39 |
| 6,603,160 B1 * | 8/2003 | Zhang | 257/288 |
| 6,873,378 B2 * | 3/2005 | Kai | 349/38 |
| 2001/0019376 A1 * | 9/2001 | Kim | 349/43 |
| 2002/0118316 A1 * | 8/2002 | Yang | 349/39 |
| 2003/0058397 A1 * | 3/2003 | Aratani et al. | 349/141 |
| 2004/0085272 A1 * | 5/2004 | Ting et al. | 345/87 |
| 2005/0156219 A1 * | 7/2005 | Chen et al. | 257/300 |

* cited by examiner

*Primary Examiner*—Andrew Schechter
*Assistant Examiner*—Matthew Tynan
(74) *Attorney, Agent, or Firm*—Cantor Colburn LLP

(57) ABSTRACT

In a thin film transistor substrate, a method of manufacturing the same, and a display apparatus having the same, a thin film transistor, a gate member, and a storage member are formed on an insulating substrate. The gate member has a gate line and a gate electrode electrically connected to the gate line, and the storage member has a storage line, a first storage electrode, and a second storage electrode. A data member is formed on an active layer. The data member includes a data line crossing the gate line, a third storage electrode overlapped with the first storage electrode and a fourth storage electrode overlapped with the second storage electrode. Thus, a capacitance variation of a storage capacitor may be prevented, thereby improving display quality of a display apparatus.

29 Claims, 12 Drawing Sheets

THIN FILM TRANSISTOR SUBSTRATE HAVING TWO STORAGE CAPACITORS PER PIXEL, METHOD OF MANUFACTURING THE SAME AND DISPLAY APPARATUS HAVING THE SAME

This application claims priority to Korean Patent Application No. 2005-33519, filed on Apr. 22, 2005 and all the benefits accruing therefrom under 35 U.S.C. §119, and the contents of which in its entirety are herein incorporated by reference.

BACKGROUND OF THE INVENTION

1. Field of the Invention

The present invention relates to a thin film transistor ("TFT") substrate, a method of manufacturing the TFT substrate, and a display apparatus having the TFT substrate. More particularly, the present invention relates to a TFT substrate capable of preventing a variation of a storage capacitance, a method of manufacturing the TFT substrate, and a display apparatus having the TFT substrate.

2. Description of the Related Art

In general, a TFT substrate is used for a circuit substrate to individually drive a plurality of pixels in a display apparatus such as a liquid crystal display ("LCD") apparatus, an organic electro luminescence apparatus, and so on.

A voltage is charged in the pixels of the TFT substrate during a predetermined time, and the voltage charged in the pixels is held by a storage capacitor during one frame.

A structure of the TFT substrate is classified into an organic layer structure and a non-organic layer structure. The TFT of an organic layer structure employs an organic layer to planarize a surface of the TFT substrate, whereas the TFT of a non-organic layer structure lacks the organic layer of the organic layer structure. In the TFT substrate of the non-organic layer structure, the storage capacitor is defined by a gate line, a pixel electrode, a gate insulating layer, and an inorganic layer. The gate insulating layer and the inorganic layer are disposed between the gate line and the pixel electrode. However, the TFT substrate of the organic layer structure further includes the organic layer disposed on the inorganic layer. In the TFT substrate of the organic layer structure, a capacitance for the storage capacitor decreases because the organic layer acts as a dielectric substance. However, when an overlapped area between the gate line and the pixel electrode increases in order to increase the capacitance for the storage capacitor, an opening ratio of the TFT substrate decreases. Thus, the storage capacitor defined by the gate line, a data line, and the gate insulating layer has been developed for the TFT substrate of the organic layer structure.

In general, the TFT substrate is manufactured via a five-mask process or a four-mask process. However, in the TFT substrate manufactured via the four-mask process where the data line and an active layer are simultaneously patterned, the active layer remains under the data line. The storage capacitor is, therefore, formed in a metal oxide semiconductor ("MOS") structure in the four-mask process.

However, a capacitor of the storage capacitor having the MOS structure periodically varies according to a polarity of a voltage applied to the storage capacitor. As a result, a display defect such as a flicker or an afterimage occurs on a screen of the LCD apparatus.

BRIEF SUMMARY OF THE INVENTION

The present invention provides a thin film transistor ("TFT") substrate capable of preventing a capacitance variation of a storage capacitor having a metal oxide semiconductor ("MOS") structure so as to improve display quality.

The present invention also provides a method of manufacturing the above-mentioned TFT substrate.

The present invention also provides a display apparatus having the above-mentioned TFT substrate.

In an exemplary embodiment of the present invention, a TFT substrate includes an insulating substrate, a gate member, a storage member, a gate insulating layer, an active layer, a data member, a passivation layer, and a pixel electrode. The gate member is formed on the insulating substrate and has a gate line and a gate electrode electrically connected to the gate line. The storage member is also formed on the insulating substrate and has a storage line, a first storage electrode, and a second storage electrode. The gate insulating layer covers the gate member and the storage member. The active layer is formed on the insulating layer and is overlapped with the gate electrode, the first storage electrode, and the second storage electrode. The data member is formed on the active layer and has a data line crossing the gate line, a third storage electrode overlapped with the first storage electrode, and a fourth storage electrode overlapped with the second storage electrode. The passivation layer covers the data member, and the pixel electrode is formed on the passivation layer.

In an exemplary embodiment of a method of manufacturing a thin film transistor substrate according to the present invention, a gate member having a gate line and a gate electrode electrically connected to the gate line is formed on an insulating substrate. A storage member having a storage line, a first storage electrode, and a second storage electrode is also formed on the insulating substrate. A gate insulating layer is then formed on the insulating substrate so that the gate insulating layer covers the gate member and the storage member. An active layer is formed on the gate insulating layer so that the active layer is overlapped with the gate electrode, the first storage electrode, and the second storage electrode. A data member is formed on the active layer. The data member has a data line crossing the gate line, a third storage electrode overlapped with the first storage electrode, and a fourth storage electrode overlapped with the second storage electrode. A passivation layer is formed on the gate insulating layer so that the passivation layer covers the active layer and the data member. A pixel electrode is formed on the passivation layer.

In still another exemplary embodiment of the present invention, a display apparatus includes a thin film transistor substrate, an opposite substrate having a common electrode formed on a surface opposite to the thin film transistor substrate, and a liquid crystal layer disposed between the thin film transistor substrate and the opposite substrate. The thin film transistor substrate includes an insulating substrate, a gate member, a storage member, a gate insulating layer, an active layer, a data member, a passivation layer, and a pixel electrode. The gate member is formed on the insulating substrate and has a gate line and a gate electrode electrically connected to the gate line. The storage member is formed on the insulating substrate and has a storage line, a first storage electrode, and a second storage electrode. The gate insulating layer covers the gate member and the storage member. The active layer is formed on the insulating layer and overlaps the gate electrode, the first storage electrode, and the second storage electrode. The data member is formed on the active layer and has a data line crossing the gate line, a third storage electrode overlapped with the first storage electrode, and a fourth storage electrode overlapped with the second storage electrode. The passivation layer covers the data member, and the pixel electrode is formed on the passivation layer.

In yet another exemplary embodiment of the present invention, a thin film transistor substrate includes a first storage capacitor and a second storage capacitor. The first and second capacitors are disposed such that an applied voltage results in oppositely oriented electrical fields at the first storage capacitor and the second storage capacitor, respectively. A capacitance variation of the first storage capacitor is compensated by a capacitance variation of the second storage capacitor and a total capacitance of the first and second storage capacitors is maintained.

According to the above, a capacitance variation of a storage capacitor may be prevented, thereby improving display quality of the display apparatus.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 1:
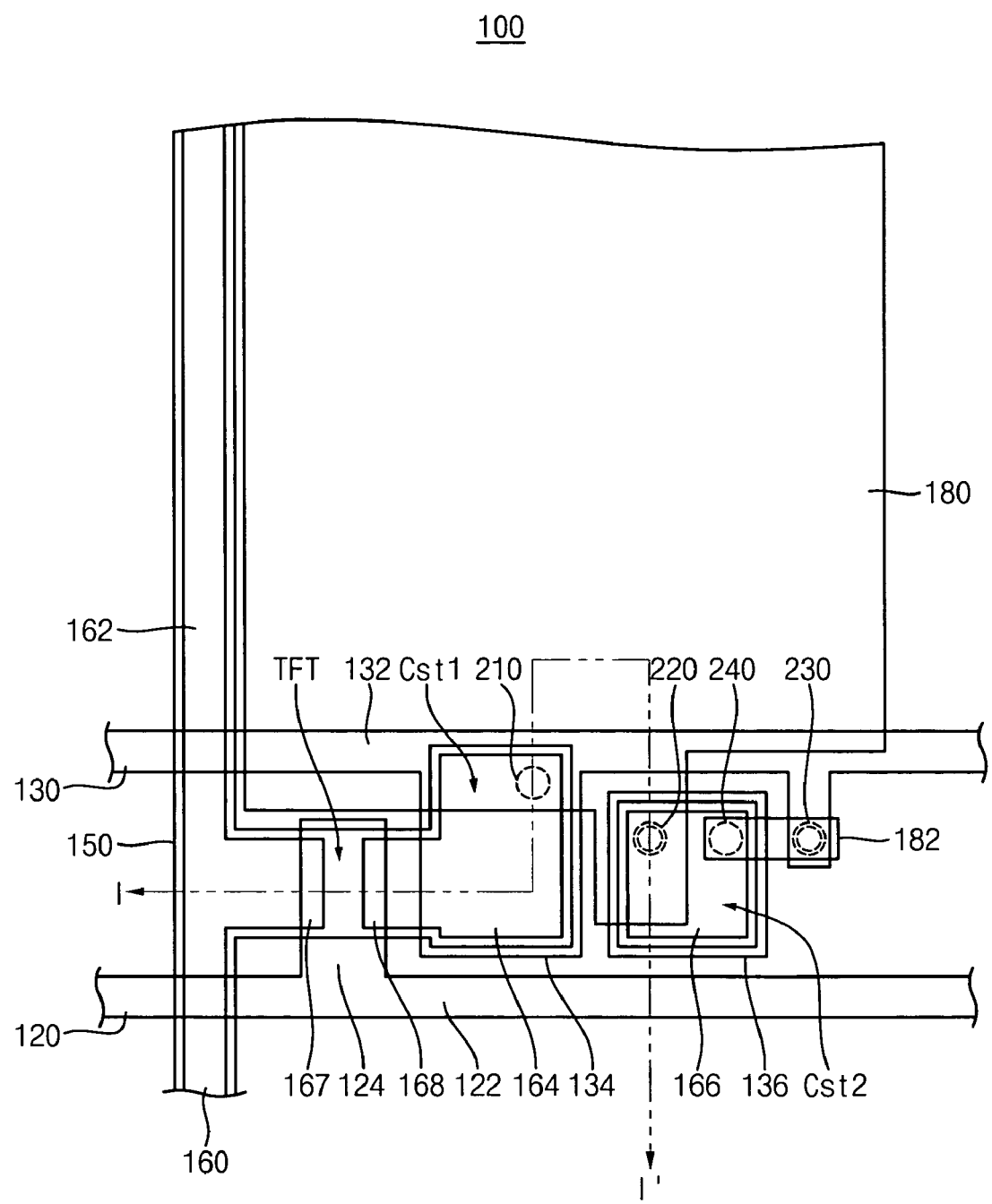
FIG. 1 is a plan view showing an exemplary embodiment of a TFT substrate according to the present invention.

It will be understood that when an element or layer is referred to as being "on", "connected to" or "coupled to" another element or layer, it can be directly on, connected to or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer or section from another region, layer, or section. Thus, a first element, component, region, layer, or section discussed below could be termed a second element, component, region, layer, or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
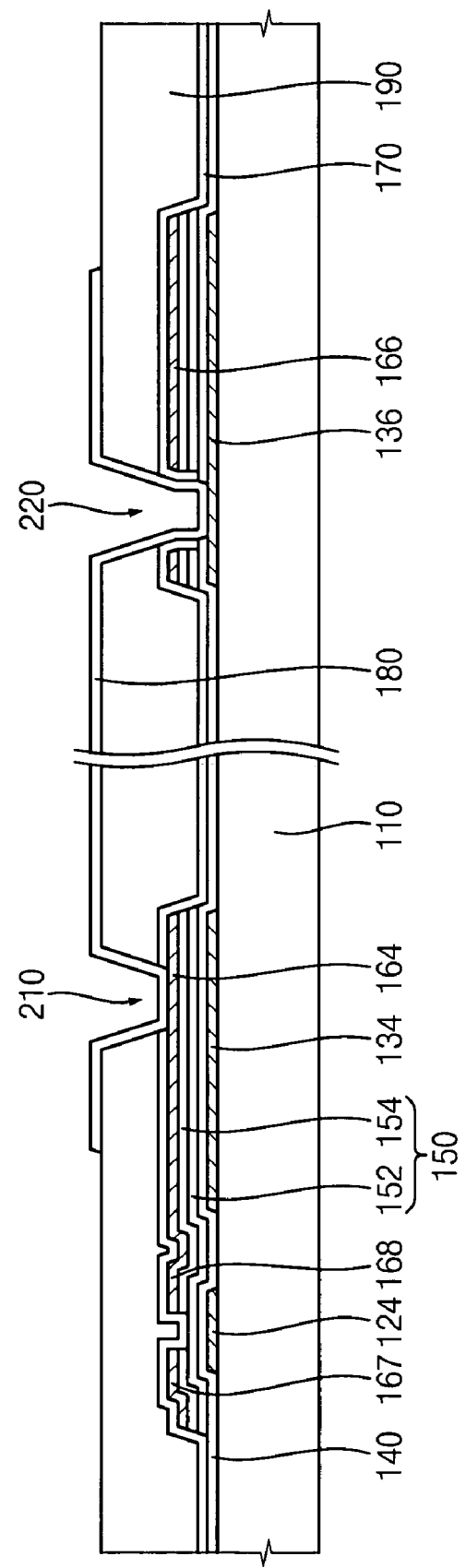
FIG. 2 is a cross-sectional view taken along line I-I' in FIG. 1.
Figure 3:
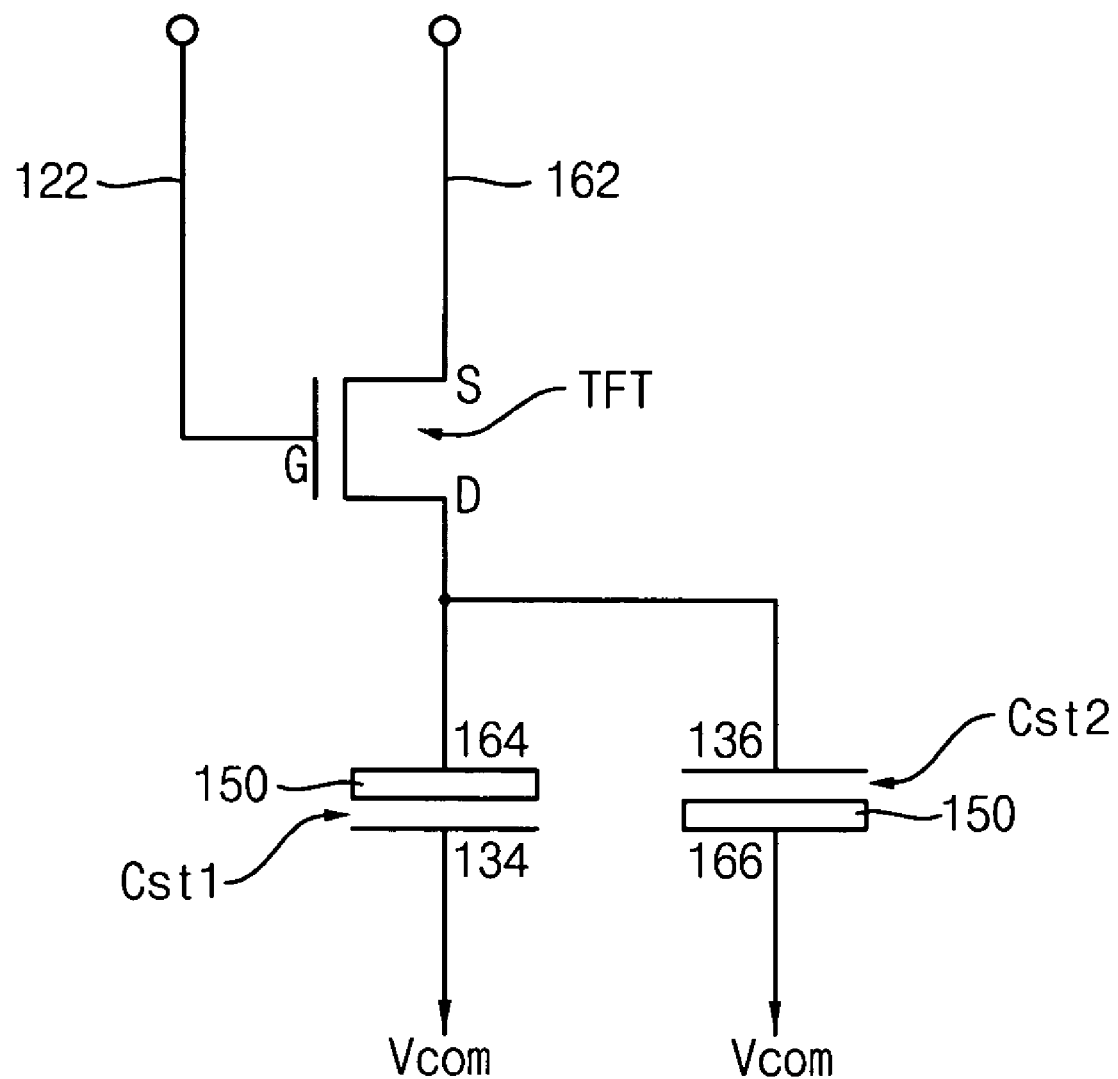
FIG. 3 is an equivalent circuit diagram of the TFT substrate in FIG. 1.

FIG. 1 is a plan view showing an exemplary embodiment of a TFT substrate according to the present invention. FIG. 2 is a cross-sectional view taken along line I-I' in FIG. 1. FIG. 3 is an equivalent circuit diagram of the TFT substrate in FIG. 1.

Referring to FIGS. 1 to 3, a TFT substrate 100 includes an insulating substrate 110, a gate member 120, a storage member 130, a gate insulating layer 140, an active layer 150, a data member 160, a passivation layer 170, and a pixel electrode 180.

The insulating substrate 110 includes a transparent material to transmit light incident into the insulating substrate 110, such as from a backlight assembly. For example, the insulating substrate 110 includes a glass, although other suitable transparent insulating materials would also be within the scope of these embodiments.

The gate member 120 is formed on the insulating substrate 110, and includes a gate line 122 and a gate electrode 124 electrically connected to the gate line 122, such as by being integrally formed with the gate line 122. The gate line 122 is extended in a horizontal direction, such as in a row direction. The gate electrode 124 is a gate terminal G of the TFT. While only one gate member 120 is illustrated, it should be understood that there may be a plurality of gate members 120 formed on the TFT substrate 100, including a plurality of substantially parallel gate lines 122, each including a gate electrode 124.

The storage member 130 is also formed on the insulating substrate 110, and includes a storage line 132, a first storage electrode 134, and a second storage electrode 136. The storage line 132 is extended in a substantially same direction as the gate line 122. That is, the storage line 132 may also extend in the horizontal direction, such as in a row direction of the TFT substrate 100, and may be substantially parallel to the gate line 122. The first storage electrode 134 is electrically connected to the storage line 132, such as by being integrally connected to the storage line 132. The second storage electrode 136 is not electrically connected to the storage line 132 and the first storage electrode 134. The second storage electrode 136 is separated from the storage line 132 and the first storage electrode 134. As will be further described below, the first storage electrode 134 is a lower electrode of a first storage capacitor Cst1, and the second storage electrode 136 is a lower electrode of a second storage capacitor Cst2. While only one storage member 130 is illustrated, it should be understood that there may be a plurality of storage members 130 formed on the TFT substrate 100, including a plurality of substantially parallel storage lines 132 and also a plurality of first and second storage electrodes 134, 136.

The storage member 130 and the gate member 120 are formed from a same layer, so that the storage member 130 and the gate member 120 include a same material and are simultaneously formed during a method of manufacturing the TFT substrate 100.

The gate insulating layer 140 is formed on the insulating substrate 110 to cover the gate member 120 and the storage member 130. In one embodiment, the gate insulating layer 140 includes a silicon nitride layer (SiNx) or a silicon oxide layer (SiOx), although other suitable insulating layers would also be within the scope of these embodiments.

The active layer 150 is formed on the gate insulating layer 140. The active layer 150 is overlapped with the gate electrode 124, the first storage electrode 134 and the second storage electrode 136. The active layer 150 includes a semiconductor layer 152 and an ohmic contact layer 154. In one embodiment, the semiconductor layer 152 includes amorphous silicon (a-Si), and the ohmic contact layer 154 includes n+ amorphous silicon (n+a-Si). N-type dopants are doped into the n+ amorphous silicon (n+a-Si) of the ohmic contact layer 154 at a high concentration.

The data member 160 is formed on the active layer 150, and includes a data line 162, a third storage electrode 164, and a fourth storage electrode 166. The data line 162 is extended in a vertical direction, such as in a column direction of the TFT substrate 100, and crosses the gate line 122, although it is insulated from the gate line 122. As illustrated, the data line 162 extends substantially perpendicularly to the gate line 122. The third storage electrode 164 is overlapped with the first storage electrode 134, and the fourth storage electrode 166 is overlapped with the second storage electrode 136. As will be further described below, the third storage electrode 164 is an upper electrode of the first storage capacitor Cst1, and the fourth storage electrode 166 is an upper electrode of the second storage capacitor Cst2. While only one data member 160 is illustrated, it should be understood that there may be a plurality of data members 160 formed on the TFT substrate 100, including a plurality of substantially parallel data lines 162, and a plurality of third and fourth storage electrodes 164, 166.

The data member 160 further includes a source electrode 167 and a drain electrode 168. The source electrode 167 is electrically connected to the data line 162, such as by being integrally connected to the data line 162 and protruding from a side of the data line 162, and the source electrode 167 is partially overlapped with a first side of the gate electrode 124. The drain electrode 168 is electrically connected to the third storage electrode 164, such as by being integrally connected to the third storage electrode 164 and protruding from a side of the third storage electrode 164, and partially overlapped with a second side of the gate electrode 124, opposite the first side of the gate electrode 124. The source electrode 167 and the drain electrode 168 are spaced apart from each other by a space overlapping a portion of the gate electrode 124 between the first and second sides of the gate electrode 124. The source electrode 167 is a source terminal S of the TFT, and the drain electrode 168 is a drain terminal D of the TFT.

The passivation layer 170 is formed on the insulating substrate 110 to cover the data member 160 and the gate insulating layer 140. The passivation layer 170 may protect the prior layers from external contamination and may further chemically tie up any unbound charges that may exist on the surface.

In this embodiment, the TFT substrate 100 further includes an organic layer 190 formed on the passivation layer 170. The organic layer 190 is formed on an entire surface of the passivation layer 170 so as to planarize a surface of the TFT substrate 100. That is, with the except of the contact holes and the pixel electrode which will be further described below, the TFT substrate 100 has a substantially planar surface as a result of the application of the organic layer 190.

The pixel electrode 180 is formed on the organic layer 190. The pixel electrode 180 is overlapped with the third storage electrode 164 and the fourth storage electrode 166. The pixel electrode 180 includes a transparent conductive material to transmit light incident into the pixel electrode 180. In one embodiment, the pixel electrode 180 includes indium zinc oxide (IZO) or indium tin oxide (ITO), although other suitable materials would also be within the scope of these embodiments.

The pixel electrode 180 is electrically connected to the third storage electrode 164 via a first contact hole 210 that is formed through the passivation layer 170 and the organic layer 190. Also, the pixel electrode 180 is electrically connected to the second storage electrode 136 via a second contact hole 220 that is formed through the gate insulating layer 140, the active layer 150, the fourth storage electrode 166, the passivation layer 170 and the organic layer 190. The pixel electrode 180 is electrically insulated from the fourth storage electrode 166 by the passivation layer 170. That is, the passivation layer 170 may cover ends of the fourth storage electrode 166 and the active layer 150 that are adjacent the second contact hole 220. Thus, the passivation layer 170 extends to the gate insulating layer 140, thus insulating the fourth storage electrode 166 from the pixel electrode 180.

In the illustrated embodiment, the TFT substrate 100 further includes a bridge electrode 182 to electrically connect the storage line 132 of the storage member 130 with the fourth storage electrode 166. The bridge electrode 182 is electrically connected to the storage line 132 via a third contact hole 230 that is formed through the gate insulating layer 140, the passivation layer 170, and the organic layer 190. The bridge electrode 182 may be connected to a section of the storage line 132 that projects substantially perpendicularly to the storage line 132 such that the bridge electrode 182 may extend substantially parallel to the storage line 132. The bridge electrode 182 is also electrically connected to the fourth storage electrode 166 via a fourth contact hole 240 that is formed through the passivation layer 170 and the organic layer 190. The bridge electrode 182 thus overlaps both the fourth storage electrode 166 and the section projecting from the storage line 132.

The bridge electrode 182 and the pixel electrode 180 are formed from a same layer, so that the bridge electrode 182 and the pixel electrode 180 include a same material, and are simultaneously formed during a method of manufacturing the TFT substrate 100.

As shown in FIG. 3, an equivalent circuit diagram of the TFT substrate 100 includes the TFT, the first storage capacitor Cst1, and the second storage capacitor Cst2. The gate terminal G, formed by gate electrode 124, of the TFT is electrically connected to the gate line 122. The source terminal S, formed by source electrode 167, of the TFT is electrically connected to the data line 162. The drain terminal D, formed by drain electrode 168, of the TFT is electrically connected to the first storage capacitor Cst1 and the second storage capacitor Cst2, in parallel.

The first storage capacitor Cst1 is defined by the first storage electrode 134, the third storage electrode 164, the gate insulating layer 140, and the active layer 150. The gate insulating layer 140 and the active layer 150 are disposed between the first storage electrode 134 and the third storage electrode 164. The second storage capacitor Cst2 is defined by the second storage electrode 136, the fourth storage electrode 166, the gate insulating layer 140, and the active layer 150. The gate insulating layer 140 and the active layer 150 are disposed between the second storage electrode 136 and the fourth storage electrode 166.

The third storage electrode 164 is electrically connected to the drain terminal D, formed by drain electrode 168, of the TFT, and the first storage electrode 134 is electrically connected to the storage line 132. A common voltage Vcom is applied to the storage line 132. The second storage electrode 136 is also electrically connected to the drain terminal D, formed by drain electrode 168, of the TFT, and the fourth storage electrode 166 is electrically connected to the storage line 132 via the bridge electrode 182.

Therefore, the first and second storage capacitors are disposed such that an applied voltage results in oppositely oriented electrical fields at the first storage capacitor Cst1 and the second storage capacitor Cst2, respectively. A capacitance variation of the first storage capacitor Cst1 is compensated by a capacitance variation of the second storage capacitor Cst2. Therefore, although polarities of voltages at the first and second storage capacitors Cst1 and Cst2 are opposite from one another, a total capacitance of the first and second storage capacitors Cst1 and Cst2 may be uniformly maintained.

In this embodiment, each pixel has one TFT to drive each pixel. Alternatively, each pixel may have two TFTs to drive each pixel.

Hereinafter, a method of manufacturing the TFT substrate will be described below with reference to FIGS. 4 to 11.

FIGS. 4 to 11 illustrate a method of manufacturing the TFT substrate in FIGS. 1 and 2.

Figure 4:
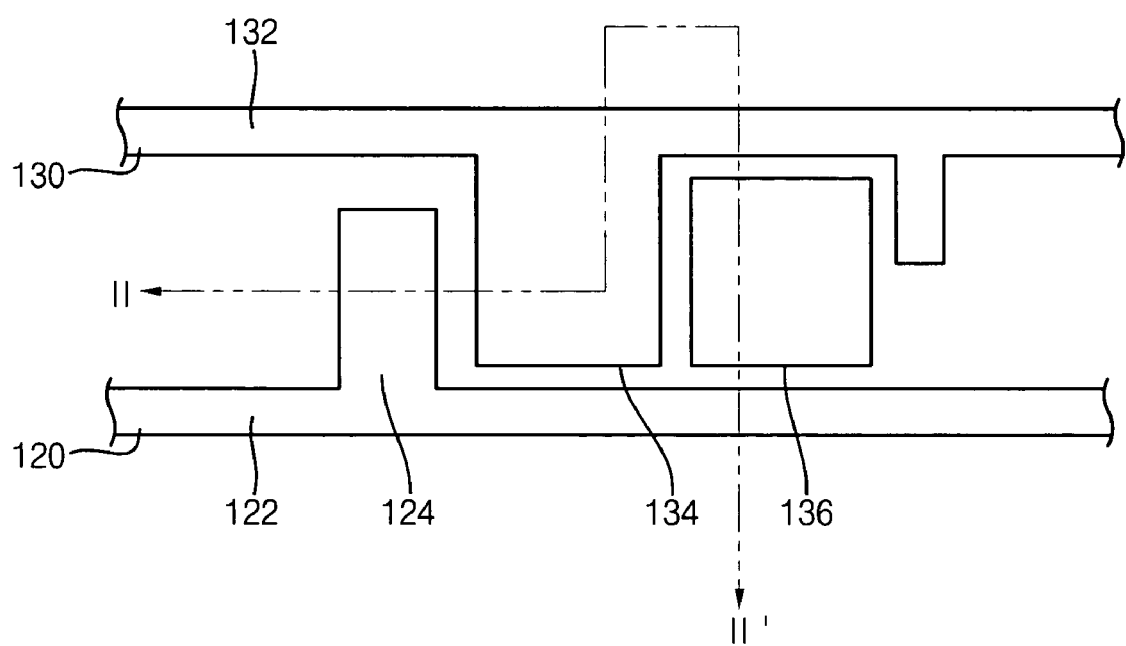
FIGS. 4, 8, and 10 are plan views illustrating an exemplary embodiment of a method of manufacturing the TFT substrate in FIGS. 1 and 2.
Figure 5:
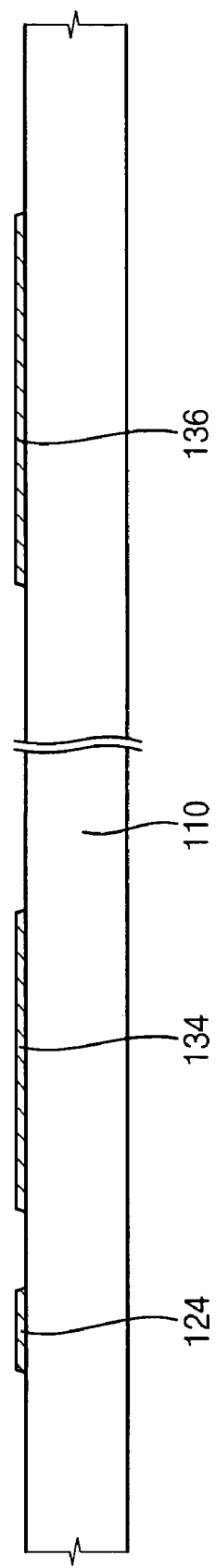
FIG. 5 is a cross-sectional view taken along line II-II' in FIG. 4.

Referring to FIGS. 4 and 5, after a first metal layer (not shown) is formed on the insulating substrate 110, the first metal layer is patterned via a photolithography process using a first mask. Photolithography is a process used to transfer a pattern from an optic mask to a layer deposited on a surface. The optic mask blocks resist exposure to UV radiation in selected areas and may include chrome opaque areas supported by a plate transparent to UV radiation. Therefore, the gate member 120 and the storage member 130 are simultaneously formed on the insulating substrate 110 through the removal of some of the first metal layer, where the remainder of the first metal layer defines the gate member 120 and the storage member 130. While a photolithography process is described, other methods of patterning the first metal layer to form the gate member 120 and the storage member 130 would also be within the scope of these embodiments.

The gate member 120 is formed on the insulating substrate 110, and includes a gate line 122 and a gate electrode 124 electrically connected to the gate line 122, such as by being integrally combined with the gate line 122. The gate line 122 is extended in a horizontal direction, or row direction, of the TFT substrate 100. The gate electrode 124 is a gate terminal G of a TFT.

The storage member 130 is also formed on the insulating substrate 110 using the first mask, and includes a storage line 132, a first storage electrode 134, and a second storage electrode 136. The storage line 132 is extended in a substantially same direction as the gate line 122, such as extending generally parallel to the gate line 122. The first storage electrode 134 is electrically connected to the storage line 132, such as by being integrally combined with the storage line 132. The second storage electrode 136 is not electrically connected to the storage line 132 or the first storage electrode 134, as it is spaced from and not directly connected to the storage line 132 and the storage electrode 134. As previously described, the first storage electrode 134 is a lower electrode of a first storage capacitor Cst1, and the second storage electrode 136 is a lower electrode of a second storage capacitor Cst2.

Figure 6:
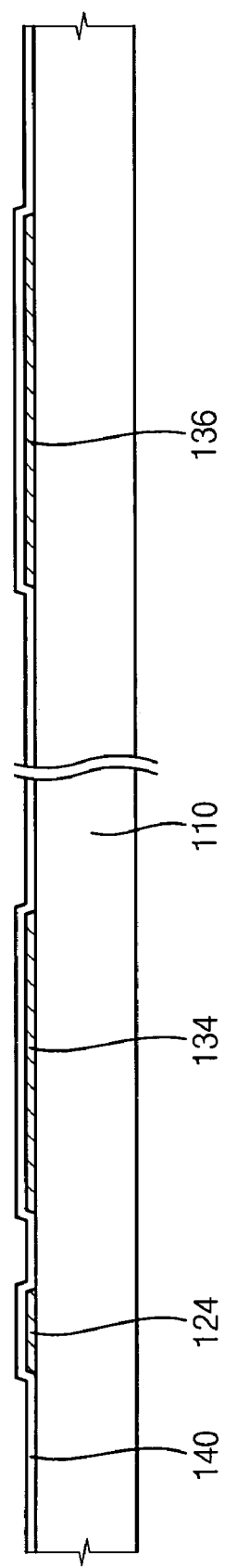
FIGS. 6 and 7 are cross-sectional views illustrating an exemplary embodiment of a method of manufacturing the TFT substrate in FIGS. 1 and 2.

Referring to FIG. 6, the gate insulating layer 140 including, for example, a silicon nitride layer (SiNx) or a silicon oxide layer (SiOx), is formed on the insulating substrate 110 having the gate member 120 and the storage member 130 on the insulating substrate 110. Thus, the gate insulating layer 140 covers the gate member 120, the storage member 130, and the remainder of the insulating substrate 110 that is not covered by either the gate member 120 or the storage member 130.

Figure 7:
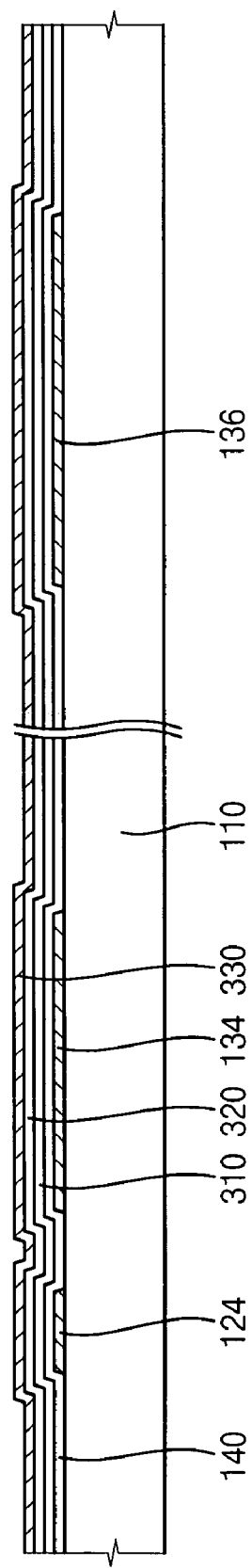

Referring to FIG. 7, an amorphous silicon (a-Si) layer 310, an n+amorphous silicon (n+a-Si) layer 320, and a second metal layer 330 are sequentially formed on the gate insulating layer 140.

Figure 8:
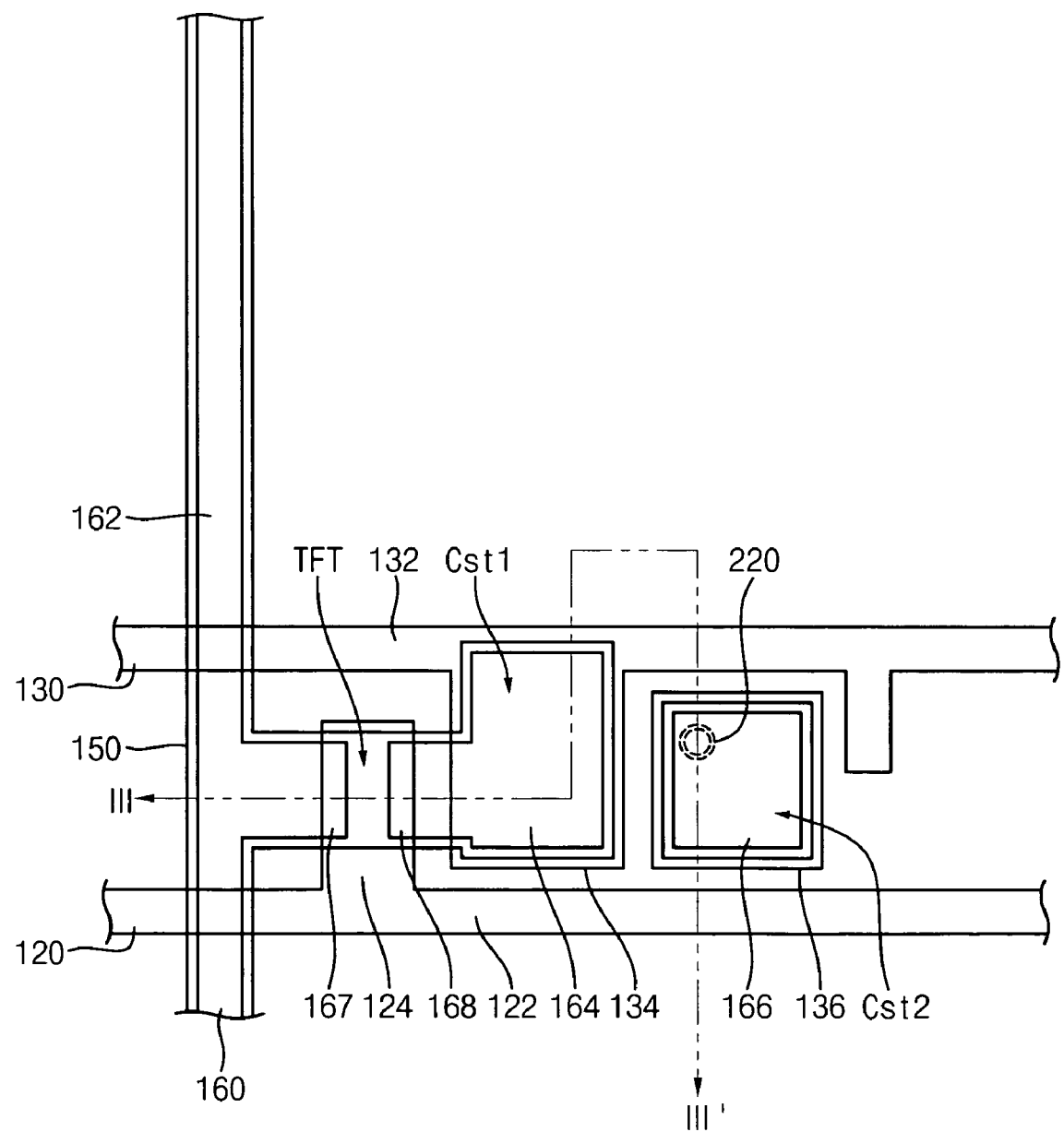
Figure 9:
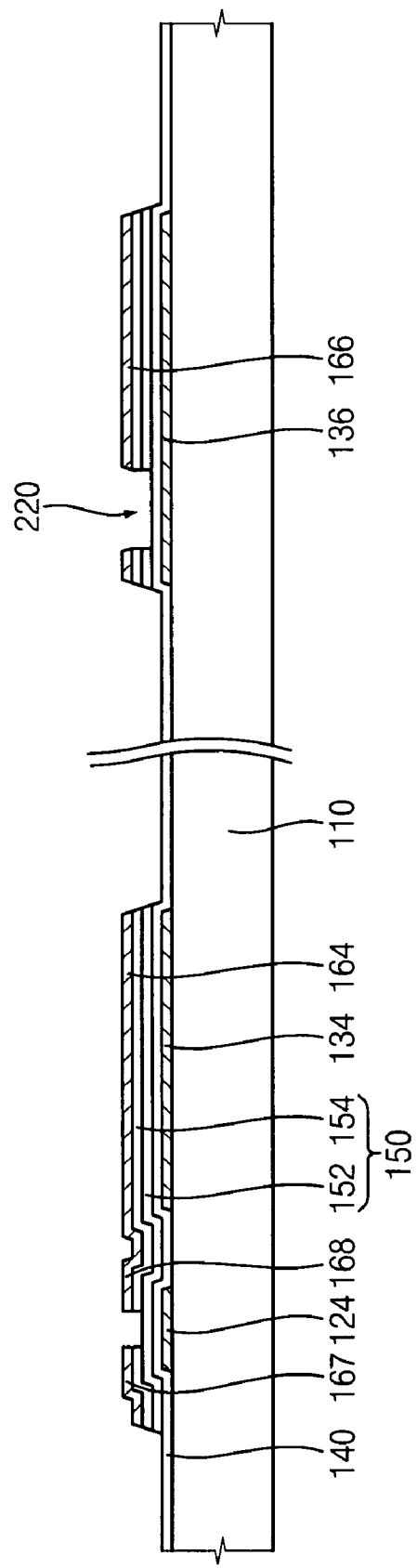
FIG. 9 is a cross-sectional view taken along line III-III' in FIG. 8.

Referring to FIGS. 8 and 9, when the a-Si layer 310, the n+a-Si layer 320, and the second metal layer 330 are patterned, such as via a photolithography process using a second mask, the active layer 150 and the data member 160 are simultaneously formed through the removal of portions of the layers 310, 320, and 330.

The active layer 150 is overlapped with the gate electrode 124, the first storage electrode 134, and the second storage electrode 136. The active layer 150 includes the semiconductor layer 152 and the ohmic contact layer 154. The semiconductor layer 152 includes amorphous silicon (a-Si) from the a-Si layer 310, and the ohmic contact layer 154 includes n+ amorphous silicon (n+a-Si) from the n+a-Si layer 320.

The data member 160, from second metal layer 330, is formed on the active layer 150, and includes a data line 162, a third storage electrode 164, and a fourth storage electrode 166. The data line 162 is extended in a vertical direction, and crosses the gate line 122. The data line 162 extends in a column direction of the TFT substrate 100, generally perpendicular to the gate line 122, and is insulated from the gate line 122. The third storage electrode 164 is overlapped with the first storage electrode 134, and the fourth storage electrode 166 is overlapped with the second storage electrode 136. As previously described, the third storage electrode 164 is an upper electrode of the first storage capacitor Cst1, and the fourth storage electrode 166 is an upper electrode of the second storage capacitor Cst2.

The data member 160 further includes a source electrode 167 and a drain electrode 168. The source electrode 167 is electrically connected to the data line 162, such as by projecting directly from the data line 162, and is partially overlapped with a first side of the gate electrode 124. The drain electrode 168 is electrically connected to the third storage electrode 164, such as by projecting directly from the third storage electrode 164, and is partially overlapped with a second side of the gate electrode 124, where the second side of the gate electrode 124 is opposite the first side of the gate electrode 124. The source electrode 167 and the drain electrode 168 are spaced apart from each other, with the space between the source electrode 167 and the drain electrode 168 overlapping a space between the first and second sides of the gate electrode 124. The source electrode 167 is a source terminal S of the TFT, and the drain electrode 168 is a drain terminal D of the TFT.

When the active layer 150 and the data member 160 are patterned, such as by using the second mask as previously described, the fourth storage electrode 166 and the active layer 150 are partially opened so as to form the second contact hole 220, although, as illustrated, the second contact hole 220 does not at this stage pass through the gate insulating layer 140.

Figure 10:
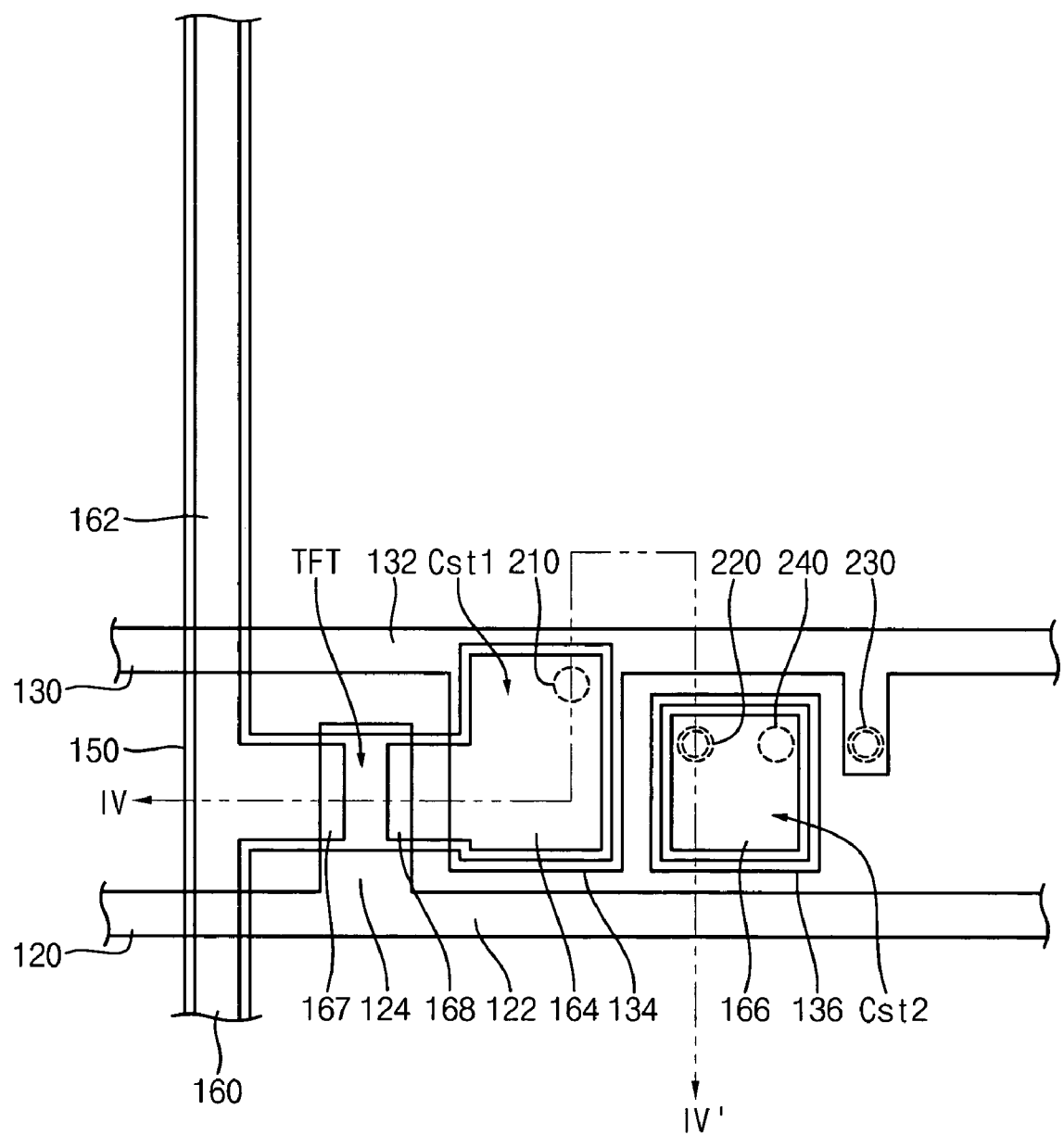
Figure 11:
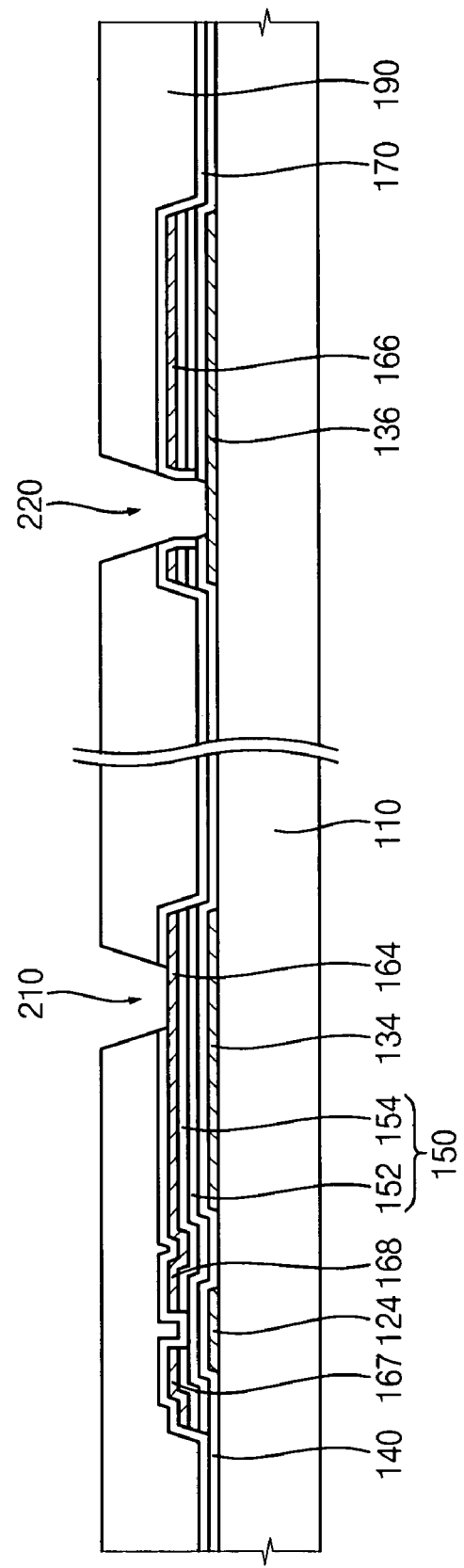
FIG. 11 is a cross-sectional view taken along line IV-IV' in FIG. 10.

Referring to FIGS. 10 and 11, the passivation layer 170 including an inorganic insulating layer is formed on the gate insulating layer 140, the active layer 150, and the data member 160. The organic layer 190 is formed on the passivation layer 170 so as to planarize the surface of the TFT substrate 100. The first contact hole 210, the second contact hole 220, the third contact hole 230, and the fourth contact hole 240 are then formed through the passivation layer 170 and the organic layer 190 via a photolithography process using a third mask. Also, the portion of the gate insulating layer 140 remaining below the second contact hole 220 is also removed to expose the second storage electrode 136.

The third storage electrode 164 is partially exposed through the first contact hole 210. The second storage electrode 136 is partially exposed through the second contact hole 220. The storage line 132, via the section that projects from the storage line 132, is partially exposed through the third contact hole 230. The fourth storage electrode 166 is partially exposed through the fourth contact hole 240. The first to fourth contact holes 210, 220, 230, 240 may have a polygonal shape or a circular shape when viewed from a plan view of the TFT substrate 100.

Referring again to FIGS. 1 and 2, after a transparent conductive layer (not shown) is formed on the passivation layer 170 and the organic layer 190, the pixel electrode 180 and the bridge electrode 182 are formed, such as via a photolithography process using a fourth mask. The pixel electrode 180 and bridge electrode 182 include a transparent conductive material to transmit light incident into the pixel electrode 180 and the bridge electrode 182. In this embodiment, examples of the transparent conductive material that can be used for the pixel electrode 180 and the bridge electrode 182 include indium zinc oxide (IZO), indium tin oxide (ITO), etc.

The pixel electrode 180 is electrically connected to the third storage electrode 164 via the first contact hole 210 that is formed through the passivation layer 170 and the organic layer 190. Also, the pixel electrode 180 is electrically connected to the second storage electrode 136 via the second contact hole 220 that is formed through the gate insulating layer 140, the active layer 150, the fourth storage electrode 166, the passivation layer 170, and the organic layer 190. The pixel electrode 180 is electrically insulated from the fourth storage electrode 166 by the passivation layer 170. That is, the passivation layer 170 may cover ends of the fourth storage electrode 166 and the active layer 150 that are adjacent the second contact hole 220. Thus, the passivation layer 170 extends to the gate insulating layer 140, thus insulating the fourth storage electrode 166 from the pixel electrode 180.

The bridge electrode 182 electrically connects the storage line 132 to the fourth storage electrode 166. The bridge electrode 182 is electrically connected to the storage line 132 via a third contact hole 230 that is formed through the gate insulating layer 140, the passivation layer 170, and the organic layer 190, where the third contact hole 230 is positioned over a projection of the storage member 130 extending from the storage line 132. Also, the bridge electrode 182 is electrically connected to the fourth storage electrode 166 via a fourth contact hole 240 that is formed through the passivation layer 170 and the organic layer 190.

Figure 12:
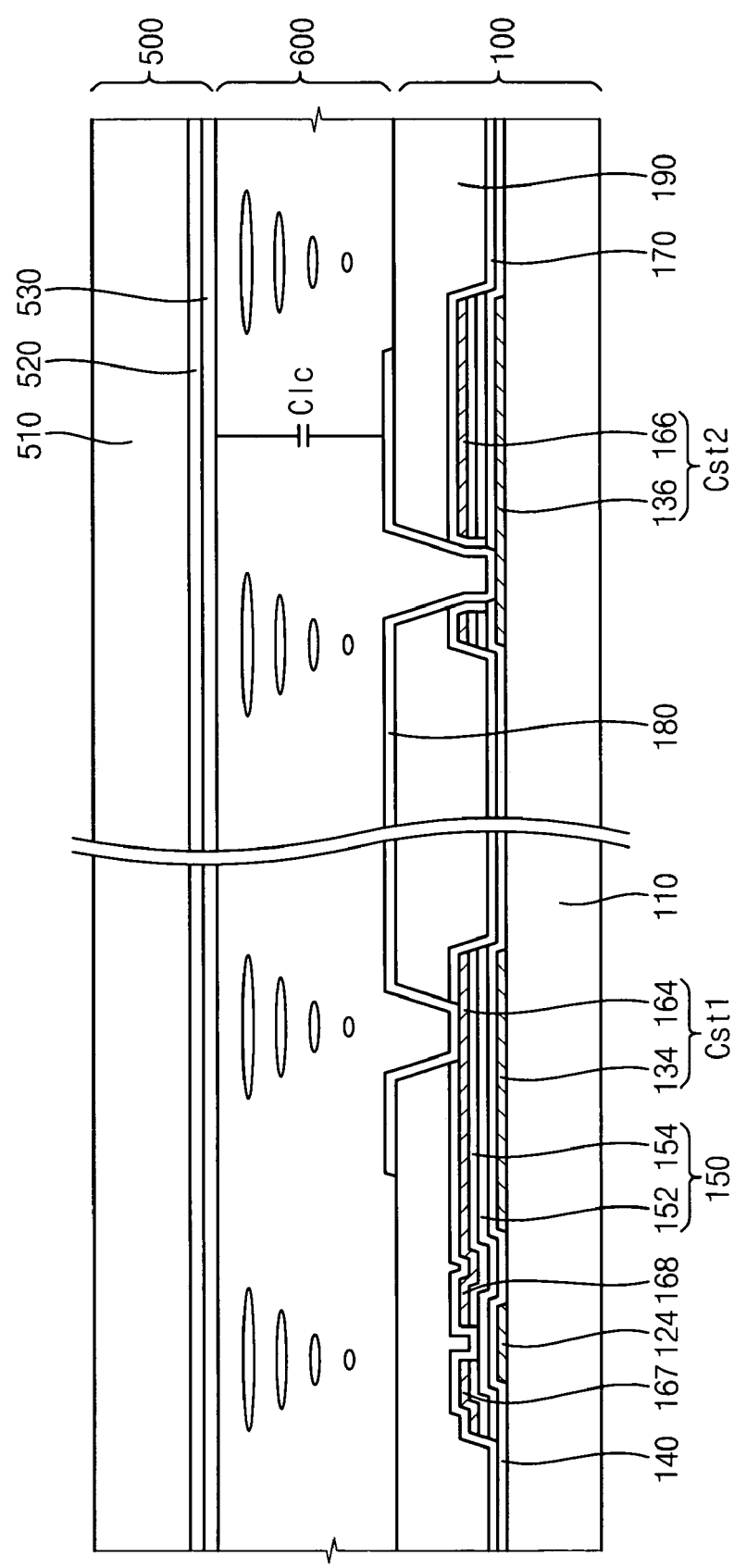
FIG. 12 is a cross-sectional view showing an exemplary embodiment of a display apparatus according to the present invention.

FIG. 12 is a cross-sectional view showing an exemplary embodiment of a display apparatus according to the present invention. In FIG. 12, the same reference numerals denote the same elements in FIG. 2, and thus any further repetitive descriptions of the same elements will be omitted.

Referring to FIG. 12, a display apparatus 400 includes a TFT substrate 100, an opposite substrate 500, and a liquid crystal layer 600.

The opposite substrate 500 is disposed in a position opposite to the TFT substrate 100. The opposite substrate 500 has a substrate 510, a color filter layer 520, and a common electrode 530.

The substrate 510 includes a transparent material to transmit light incident into the substrate 510. In one embodiment, the substrate 510 includes a substantially same glass material as the insulating substrate 110 of the TFT substrate 100, although alternate suitable transparent materials would also be within the scope of these embodiments.

The color filter layer 520 has a red color pixel, a green color pixel, and a blue color pixel so as to display color images. In an alternative embodiment, the color filter layer 520 may be formed on the TFT substrate 100.

The common electrode 530 is formed on a surface of the opposite substrate 500 opposite to the TFT substrate 100. In one embodiment, the common electrode 530 includes a substantially same transparent conductive material as the pixel electrode 180 of the TFT substrate 100 so as to transmit light incident into the common electrode 530. Examples of the transparent conductive material that can be used for the common electrode 530 include indium zinc oxide (IZO), indium tin oxide (ITO), etc.

The liquid crystal layer 600 is disposed between the TFT substrate 100 and the opposite substrate 500. The liquid crystal layer 600 includes a plurality of liquid crystal molecules having optical and electrical characteristics such as an anisotropic refractive index, an anisotropic dielectric constant, etc. The alignment of the liquid crystal molecules is varied in response to an electric field formed between the pixel electrode 180 and the common electrode 530, thereby controlling a transmittance of light passing through the liquid crystal layer 600.

The display apparatus 400 includes a liquid crystal capacitor Clc that is defined by the pixel electrode 180, the liquid crystal layer 600, and the common electrode 530. The liquid crystal capacitor Clc is electrically connected to the first storage capacitor Cst1 and the second storage capacitor Cst2, in parallel, as further previously described with respect to FIG. 3.

According to the above, the TFT substrate has two storage capacitors having an MOS structure, and the first and second storage capacitors are disposed such that an applied voltage results in oppositely oriented electrical fields at two storage capacitors, respectively. Therefore, a capacitance variation may be compensated and a total capacitance of the first and second storage capacitors may be uniformly maintained, and thus a flicker and an afterimage may be prevented. As a result, display quality of the display apparatus may be improved.

Further, the TFT substrate having an organic layer is manufactured via a four-mask process, thereby improving a productivity thereof and reducing a manufacturing cost.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A thin film transistor substrate comprising:
   an insulating substrate;
   a gate member formed on the insulating substrate, the gate member having a gate line and a gate electrode electrically connected to the gate line;
   a storage member formed on the insulating substrate, the storage member having a storage line, a first storage electrode, and a second storage electrode;
   a gate insulating layer covering the gate member and the storage member;
   an active layer formed on the gate insulating layer, the active layer overlapped with the gate electrode, the first storage electrode, and the second storage electrode;
   a data member formed on the active layer, the data member having a data line, a third storage electrode, and a fourth storage electrode, the data line crossing the gate line, the third storage electrode overlapped with the first storage electrode, and the fourth storage electrode overlapped with the second storage electrode;
   a passivation layer covering the data member; and
   a pixel electrode formed on the passivation layer,
   wherein a contact hole is formed through the gate insulating layer, the active layer, the fourth storage electrode and the passivation layer, and the second storage electrode is electrically connected to the pixel electrode via the contact hole.

2. The thin film transistor substrate of claim 1, wherein the gate insulating layer and the active layer are disposed between the first storage electrode and the third storage electrode and between the second storage electrode and the fourth storage electrode,
   a first capacitor is defined by the first storage electrode, the third storage electrode, the gate insulating layer, and the active layer, and
   a second capacitor is defined by the second storage electrode, the fourth storage electrode, the gate insulating layer, and the active layer.

3. The thin film transistor substrate of claim 2, wherein the first and second capacitors are disposed such that the applied voltage results in oppositely oriented electrical fields at the first capacitor and the second capacitor.

4. The thin film transistor substrate of claim 3, wherein a capacitance variation of the first capacitor is compensated by a capacitance variation of the second capacitor and a total capacitance of the first and second capacitors is maintained.

5. The thin film transistor substrate of claim 1, wherein the data member further comprises:
   a source electrode electrically connected to the data line, the source electrode partially overlapped with the gate electrode; and
   a drain electrode electrically connected to the third storage electrode, the drain electrode partially overlapped with the gate electrode.

6. The thin film transistor substrate of claim 1, wherein a contact hole is formed through the passivation layer, and the third storage electrode is electrically connected to the pixel electrode via the contact hole.

7. The thin film transistor substrate of claim 1, wherein the fourth storage electrode is electrically insulated from the pixel electrode by the passivation layer.

8. The thin film transistor substrate of claim 1, further comprising a bridge electrode electrically connecting the storage line to the fourth storage electrode.

9. The thin film transistor substrate of claim 8, wherein the bridge electrode is electrically connected to the storage line via a contact hole formed through the gate insulating layer and the passivation layer, and the bridge electrode is electrically connected to the fourth storage electrode via another contact hole formed through the passivation layer.

10. The thin film transistor substrate of claim 1, wherein the third storage electrode electrically connected to the pixel electrode via a first contact hole, the second storage electrode electrically connected to the pixel electrode via a second contact hole.

11. The thin film transistor substrate of claim 10, further comprising a bridge electrode electrically connecting the storage line to the fourth storage electrode, and further comprising a third contact hole and a fourth contact hole, the bridge electrode electrically connected to the storage line via the third contact hole and the bridge electrode electrically connected to the fourth storage electrode via the fourth contact hole.

12. The thin film transistor substrate of claim 1, further comprising an organic layer formed between the passivation layer and the pixel electrode.

13. A method of manufacturing a thin film transistor substrate, the method comprising:
   forming a gate member having a gate line and a gate electrode electrically connected to the gate line on an insulating substrate;
   forming a storage member having a storage line, a first storage electrode, and a second storage electrode on the insulating substrate;
   forming a gate insulating layer on the insulating substrate to cover the gate member and the storage member;
   forming an active layer on the gate insulating layer to overlap the gate electrode, the first storage electrode, and the second storage electrode;
   forming a data member on the active layer, the data member having a data line crossing the gate line, a third storage electrode overlapped with the first storage electrode, and a fourth storage electrode overlapped with the second storage electrode;

forming a passivation layer on the gate insulating layer to cover the active layer and the data member; and forming a pixel electrode on the passivation layer, wherein the second storage electrode is electrically connected to the pixel electrode via a contact hole formed through the gate insulating layer, the active layer, the fourth storage electrode, and the passivation layer.

14. The method of claim 13, further comprising patterning a first metal layer deposited on the insulating substrate using a first mask to form the gate member and the storage member.

15. The method of claim 13, further comprising patterning a semiconductor layer, an ohmic contact layer, and a second metal layer sequentially deposited on the gate insulating layer using a mask to form the active layer and the data member.

16. The method of claim 13, further comprising patterning a first metal layer deposited on the insulating substrate using a first mask to form the gate member and the storage member, and patterning a semiconductor layer, an ohmic contact layer, and a second metal layer sequentially deposited on the gate insulating layer using a second mask to form the active layer and the data member.

17. The method of claim 16, further comprising using a third mask to form contact holes through the passivation layer and using a fourth mask to form the pixel electrode.

18. The method of claim 13, wherein the third storage electrode is electrically connected to the pixel electrode via a contact hole formed through the passivation layer.

19. The method of claim 13, further comprising forming a bridge electrode to electrically connect the storage line to the fourth storage electrode.

20. The method of claim 19, wherein the bridge electrode is electrically connected to the storage line via a contact hole formed through the gate insulating layer and the passivation layer, and to the fourth storage electrode via another contact hole formed through the passivation layer.

21. The method of claim 19, wherein the bridge electrode comprises a same material as the pixel electrode, and further comprising simultaneously forming the bridge electrode and the pixel electrode.

22. The method of claim 13, further comprising forming a first contact hole and a second contact hole, electrically connecting the third storage electrode to the pixel electrode via the first contact hole, and electrically connecting the second storage electrode to the pixel electrode via the second contact hole.

23. The method of claim 22, further comprising forming a bridge electrode electrically connecting the storage line to the fourth storage electrode, forming a third contact hole and a fourth contact hole, electrically connecting the bridge electrode to the storage line via the third contact hole, and electrically connecting the bridge electrode to the fourth storage electrode via the fourth contact hole.

24. The method of claim 13, further comprising forming an organic layer on the passivation layer.

25. A display apparatus comprising:

a thin film transistor substrate comprising:

an insulating substrate;

a gate member formed on the insulating substrate, the gate member having a gate line and a gate electrode electrically connected to the gate line;

a storage member formed on the insulating substrate, the storage member having a storage line, a first storage electrode, and a second storage electrode;

a gate insulating layer covering the gate member and the storage member;

an active layer formed on the insulating layer, the active layer overlapping the gate electrode, the first storage electrode, and the second storage electrode;

a data member formed on the active layer, the data member having a data line, a third storage electrode, and a fourth storage electrode, the data line crossing the gate line, the third storage electrode overlapped with the first storage electrode, and the fourth storage electrode overlapped with the second storage electrode;

a passivation layer covering the data member; and a pixel electrode formed on the passivation layer;

an opposite substrate having a common electrode formed on a surface opposite the thin film transistor substrate; and a liquid crystal layer disposed between the thin film transistor and the opposite substrate, wherein the second storage electrode is electrically connected to the pixel electrode via a second contact hole formed through the gate insulating layer, the active layer, the fourth storage electrode, and the passivation layer.

26. The display apparatus of claim 25, wherein the third storage electrode is electrically connected to the pixel electrode via a first contact hole formed through the passivation layer.

27. The display apparatus of claim 25, wherein the bridge electrode is electrically connected to the storage line via a third contact hole, and the bridge electrode is electrically connected to the fourth storage electrode via a fourth contact hole.

28. The display apparatus of claim 25, wherein the bridge electrode is electrically connected to the storage line via a contact hole formed through the gate insulating layer and the passivation layer, and the bridge electrode is electrically connected to the fourth storage electrode via another contact hole formed through the passivation layer.

29. The display apparatus of claim 25, wherein the thin film transistor substrate further comprises an organic layer formed between the passivation layer and the pixel electrode.

* * * * *